United States Patent
Morita

(10) Patent No.: US 7,519,252 B2
(45) Date of Patent: Apr. 14, 2009

(54) LASER ANNEALING APPARATUS

(75) Inventor: Hiroyuki Morita, Kanagawa (JP);
Keiko Morita, legal representative, Fukuoka (JP)

(73) Assignee: Laserfront Technologies, Inc., Kanagawa (JP)

( * ) Notice: Subject to any disclaimer, the term of this patent is extended or adjusted under 35 U.S.C. 154(b) by 0 days.

(21) Appl. No.: 11/691,131

(22) Filed: Mar. 26, 2007

(65) Prior Publication Data
US 2007/0237475 A1 Oct. 11, 2007

(30) Foreign Application Priority Data
Mar. 27, 2006 (JP) ............................. 2006-086712

(51) Int. Cl.
*G02B 6/04* (2006.01)
(52) U.S. Cl. ........................ 385/115; 385/100; 385/123; 372/9; 372/10
(58) Field of Classification Search ................. 385/100, 385/115, 123; 372/9, 10
See application file for complete search history.

(56) References Cited

U.S. PATENT DOCUMENTS 6,770,844 B2 * 8/2004 Morita .................. 219/121.77
6,869,428 B2 * 3/2005 Sagehashi et al. ............... 606/4

FOREIGN PATENT DOCUMENTS

| JP | 2001-156017 A | 6/2001 |
| JP | 2002-280324 A | 9/2002 |

* cited by examiner

*Primary Examiner*—Jennifer Doan
(74) *Attorney, Agent, or Firm*—Sughrue Mion, PLLC

(57) ABSTRACT

A laser annealing apparatus comprises a laser oscillator having a Q switching action, one or a plurality of partially reflective mirrors for split a laser beam emitted from the laser oscillator into a plurality of laser beams, a plurality of optical fibers which respectively transmit the plurality of laser beams split by the partially reflective mirrors, and whose respective emission ends are arranged linearly in one direction, a first optical system for synthesizing and homogenizing the plurality of laser beams emitted from the optical fibers, and a second optical system for focusing the laser beam emitted from the first optical system on the work piece surface as a rectangular laser beam whose beam shape is long in the lateral direction and short in the longitudinal direction. As a result, laser power transmission by means of slender optical fibers is possible even in cases in which a green laser such as the second harmonic of an Nd:YAG laser having a Q switching action or the like is used as a heating light source. Accordingly, a compact laser annealing apparatus that has a high-quality working performance and does not require a laser amplifier or high-frequency generating apparatus can be obtained.

7 Claims, 9 Drawing Sheets

LASER ANNEALING APPARATUS

BACKGROUND OF THE INVENTION

1. Field of the Invention

The present invention relates to a laser annealing apparatus, and more particularly to a laser annealing apparatus which is suitable for use in crystallization annealing processes of low-temperature poly-silicon TFT (thin film transistors) and the like.

2. Description of the Related Art

In the crystallization annealing processes of low-temperature poly-silicon TFT, XeCl lasers are widely used as heating light sources. Recently, the fact that green lasers having a high peak power, as represented by the second harmonic of Nd:YAG (yttrium aluminum garnet) lasers having a Q switching action, can be used as heating light sources has attracted great attention because of the ability of such lasers to achieve greater crystal growth at a lower running cost. In annealing processes using green lasers having a high peak power, a system in which a laser beam is formed as a linear beam and directed onto the substrate is most widely used.

FIG. 1 is a schematic diagram showing one example of the construction of a conventional laser annealing apparatus. In a conventional apparatus, a laser beam 206 emitted from a laser oscillator 201 is directly introduced into a linear beam formation optical system 202. The linear beam formation optical system 202 is fixed in place, and the laser beam 206 is propagated using mirrors or the like. The beam intensity is made uniform in the long direction, and the beam is directly focused in the short direction. The laser beam 206 is converted into a linear beam 207 by the linear beam formation optical system 202. The linear beam 207 is directed onto an amorphous silicon substrate 204 which is carried on a stage 208, and the portion of the amorphous silicon substrate 204 that is irradiated by the linear beam 207 is modified to poly-silicon 205. The laser oscillator 201 is carried on a biaxial operating stage 203, and the entire surface of the amorphous silicon substrate 204 is irradiated by the linear beam 207 by scanning the biaxial operating stage 203 in two dimensions.

For example, a laser light linear beam forming method and a laser annealing apparatus using this method are disclosed in Japanese Laid-Open Patent Application No. 2001-156017 as one example of the linear beam formation optical system 202. FIG. 2A is a side view showing the construction of the optical system 300 that forms a linear laser beam as disclosed in Japanese Laid-Open Patent Application No. 2001-156017. FIG. 2B is a plan view of the same, and FIG. 3 is a schematic diagram showing a laser annealing apparatus. Laser light emitted from a laser oscillator 301 is split in the longitudinal direction by a cylindrical lens array 302. The laser light that is split in the longitudinal direction is further split in the lateral direction by a cylindrical lens array 303. Specifically, the laser light that is emitted from the laser oscillator 301 is split into the form of a matrix by the cylindrical lens array 302 and cylindrical lens array 303.

Subsequently, the laser light is temporarily focused by a cylindrical lens 304. In this case, the light passes through a cylindrical lens 305 immediately after the cylindrical lens 304. The light then reflects from a mirror 306, passes through a cylindrical lens 307, passes through a slit 308, and reaches the irradiated surface 309. In this case, the laser light that is projected onto the irradiated surface 309 exhibits a linear irradiating surface. Specifically, the cross-sectional shape of the laser light that passes through the cylindrical lens 307 is linear. The slit 308 is used to adjust the length of the linear laser light in the direction of length.

The homogenization in the short direction of the beam shape of this linearly converted laser light is accomplished by means of the cylindrical lens array 302 and cylindrical lenses 304 and 307. Furthermore, the homogenization in the long direction is accomplished by means of the cylindrical lens array 303 and cylindrical lens 305. The linear beam of the laser light that has thus been made uniform is directed onto a substrate 311 that is carried on a movable stage 310.

However, in cases in which the laser oscillator 201 shown in FIG. 1 has an extremely high output, or in cases in which a plurality of laser oscillators 201 is mounted, the total weight of the optical system, including the linear beam formation optical system 202, reaches several hundred kilograms. Furthermore, if the alignment of the optical system including the laser oscillator 201 is taken into account, the scanning of the linear beam formation optical system 202 lacks stability, is poor in terms of flexibility, and is impractical. Accordingly, systems are now used in which the amorphous silicon substrate 204 is scanned instead of the linear beam formation optical system 202 (for example, see Japanese Laid-Open Patent Application No. 2001-156017).

Methods in which the flexibility of the optical system is improved by propagating a laser beam via optical fibers are also conceivable. However, as the output of the laser oscillator is increased, there is a danger of damage to the optical fibers because of the damage limit of the optical fibers with respect to the laser power density, and the use of small-diameter optical fibers becomes difficult. Accordingly, an extremely high-ratio reducing optical system is required in order to focus the light in the short direction of the beam shape of the linear beam. However, the actual manufacture of such optical systems is extremely difficult. Furthermore, in the case of laser oscillators operated by Q switching, arbitrary control of the laser pulse waveform and spatial intensity distribution is difficult, and conditions that are optimal for working therefore cannot always be obtained.

Recently, in order to solve these problems, a method has been proposed in Japanese Laid-Open Patent Application No. 2002-280324 (pages 4 to 10 and FIG. 1). In this method, a laser oscillating in the near infrared region is caused to perform split propagation by means of a plurality of fibers, the light is amplified by a fiber amplifier and converted into a third harmonic, and the light is then formed into a linear beam and caused to irradiate the substrate.

The construction of the laser apparatus disclosed in Japanese Laid-Open Patent Application No. 2002-280324 is shown in FIG. 4. For example, this laser apparatus 400 is constructed from a near infrared micro-chip laser having an oscillation wavelength of 914 nm, and has a master laser 401 as a laser light source which emits reference laser pulsed light RPref having a wavelength of 914 nm and a pulse width of 0.5 ns; a beam expander 402 comprising two lenses 402a and 402b whose focal points are caused to coincide; a micro-lens array 403 which splits the reference laser pulsed light RPref converted into a large-diameter parallel light ray bundle by the beam expander 402 into N light beams; optical fiber amplifiers 404-1 through 404-N which amplify the split reference laser pulsed light beams DRPref1 through DRPrefN that are propagated, and whose lengths are sequentially set so as to obtain a propagation delay time of 0.5 ns, which is the pulse width of the split reference laser pulsed light beams DRPref1 through DRPrefN; fiber-coupled excitation laser light sources 405-1 through 405-N; excitation light propagating optical fibers 406-1 through 406-N; a third harmonic generating apparatus 407 for receiving the split reference laser pulsed light beams DRPref1 through DRPrefN that have a wavelength of 914 nm and are emitted from the other end surfaces of the optical fiber amplifiers 404-1 through 404-N, and generating third harmonics TRD1 through TRDN having a wavelength of 305 nm and a pulse width of 0.5 ns; and an illuminating optical system 408 in which the laser pulsed light of N third harmonics TRD1 through TRDN obtained by wavelength conversion in the third harmonic generating apparatus 407 is connected and placed in parallel, and pulsed light is emitted whose pulse width is at least N times that of the reference laser pulsed light RPref that has a pulse width of 0.5 ns and is subjected to so-called time multiplexing.

A light wave splitting means is constructed by the beam expander 402 and micro-lens array 403, and a light synthesis means is constructed by the third harmonic generating apparatus 407 and illuminating optical system 408. Furthermore, an excitation light supply means is constructed by the excitation laser light sources 405-1 through 405-N, the excitation light propagating optical fibers 406-1 through 406-N, and optical fiber couplers 414-1 through 414-N.

Furthermore, in Japanese Laid-Open Patent Application No. 2002-280324, it is indicated that the fluence that is required in order to anneal a TFT using an XeCl excimer laser having a wavelength of 308 nm is several hundred $J/cm^2$, and that the pulse width is approximately 20 ns. Moreover, in Japanese Laid-Open Patent Application No. 2002-280324, it is indicated that when a micro-chip laser having a wavelength of 914 nm and a pulse width of 0.5 ns is used as the master laser, it is necessary to amplify the split reference laser pulsed light beams DRPref1 through DRPrefN having a wavelength of 914 nm by means of the optical fiber amplifiers 404-1 through 404-N, and to convert these amplified laser pulsed light beams into third harmonics TRD1 through TRDN having a wavelength of 305 nm and a pulse width of 0.5 ns by means of the third harmonic generating apparatus 407, in order to obtain the necessary fluence described above.

However, in the laser apparatus disclosed in Japanese Laid-Open Patent Application No. 2002-280324, as was described above, it is necessary to amplify the split reference laser pulsed light beams DRPref1 through DRPrefN having a wavelength of 914 nm to a power density of several tens of $MW/mm^2$ or greater by means of the optical fiber amplifiers 404-1 through 404-N. Otherwise sufficient conversion efficiency cannot be obtained at the time of conversion into third harmonics by the third harmonic generating apparatus 407.

SUMMARY OF THE INVENTION

It is an object of the present invention to provide a compact laser annealing apparatus which makes it possible to transmit laser power by means of a slender optical fiber even in cases in which a green laser with a high peak power such as the second harmonic of an Nd:YAG laser having a Q switching action or the like is used as a heating light source, and which therefore allows high-quality working to be carried out without any need for a laser amplifier or a high frequency generating apparatus.

The laser annealing apparatus according to the present invention comprises a laser oscillator having a Q switching action; one or a plurality of partially reflective mirrors for splitting a laser beam emitted from the laser oscillator into a plurality of beams; a plurality of optical fibers which respectively transmit the plurality of laser beams split by the partially reflective mirrors, and whose respective emission ends are arranged linearly in one direction; a first optical system for synthesizing and homogenizing the plurality of laser beams emitted from the optical fibers; and a second optical system for focusing the laser beam emitted from the first optical system on the work piece surface as a rectangular laser beam whose beam shape is long in the lateral direction and short in the longitudinal direction.

The optical fibers are set at lengths that differ from each other in units of single fibers or a plurality of fibers; the amount of optical transmission delay of the emitted laser beams can be caused to vary at the emission ends of the optical fibers; and the laser beam waveform can be caused to vary from the waveform at the time of emission from the laser oscillator.

A plurality of laser oscillators can be provided, the optical fibers can be connected to the plurality of laser oscillators in units of single fibers or a plurality of fibers, and the pulse oscillation timing of the laser beams emitted from the laser oscillators can be adjusted and the pulse waveform of the laser beams emitted from the optical fibers can be varied over time.

It is desirable that the intensity of the laser beams that are incident on the optical fibers be varied in units of single fibers or a plurality of fibers by varying the reflectivity of the partially reflective mirrors.

The core diameters of the optical fibers can be varied in units of single fibers or a plurality of fibers, and the beam intensity distribution in the short longitudinal direction of the beam shape of the laser beams focused by the second optical system can be adjusted.

The emission ends of the optical fibers can be shifted in a direction perpendicular to the aforementioned single direction in units of single fibers or a plurality of fibers, and the pulse waveform of the laser beams can be shifted in the short longitudinal direction of the beam shape focused by the second optical system.

The beam intensity distribution in the short longitudinal direction of the beam shape of the laser beams can be adjusted by varying the core diameter in units of single fibers or a plurality of fibers, and the pulse waveform of the laser beams can be shifted in the short longitudinal direction of the beam shape by arranging the emission ends so that the ends are shifted in the direction perpendicular to the aforementioned single direction in units of single fibers or a plurality of fibers.

In the present invention, laser power transmission can be accomplished without damaging the end surfaces of slender optical fibers even in cases in which a green laser with a high peak power such as the second harmonic of an Nd:YAG laser having a Q switching action is used as the heating light source in the crystallization annealing process of a low-temperature poly-silicon TFT. Accordingly, a laser annealing apparatus having a high-quality working performance which does not require a laser amplifier or a high frequency generating apparatus can be realized, and the operating stage of the laser annealing apparatus can be made compact.

DESCRIPTION OF THE PREFERRED EMBODIMENTS

Figure 1:
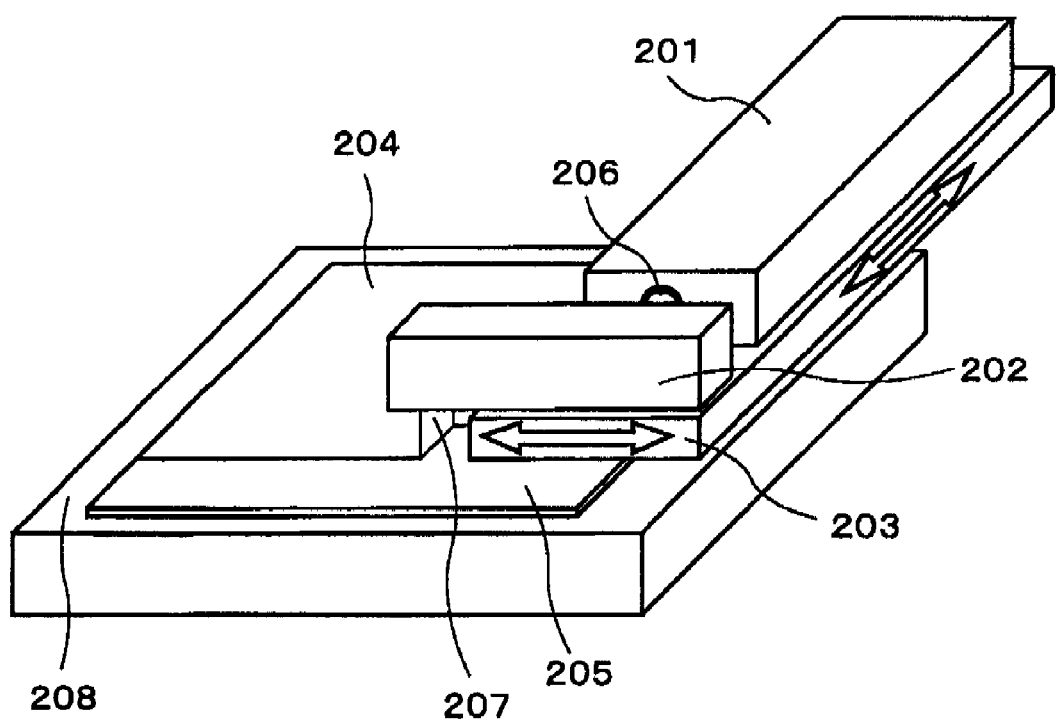
FIG. 1 is a schematic diagram showing one example of the construction of a conventional laser annealing apparatus.
Figure 2A:
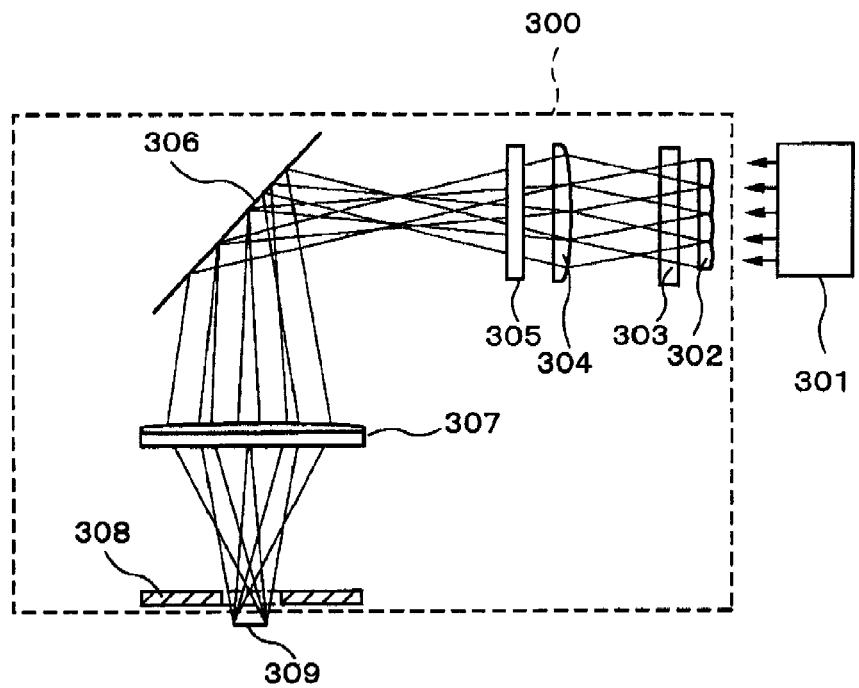
FIG. 2A is a side view showing the construction of a conventional optical system for converting laser light into a linear form.
Figure 2B:
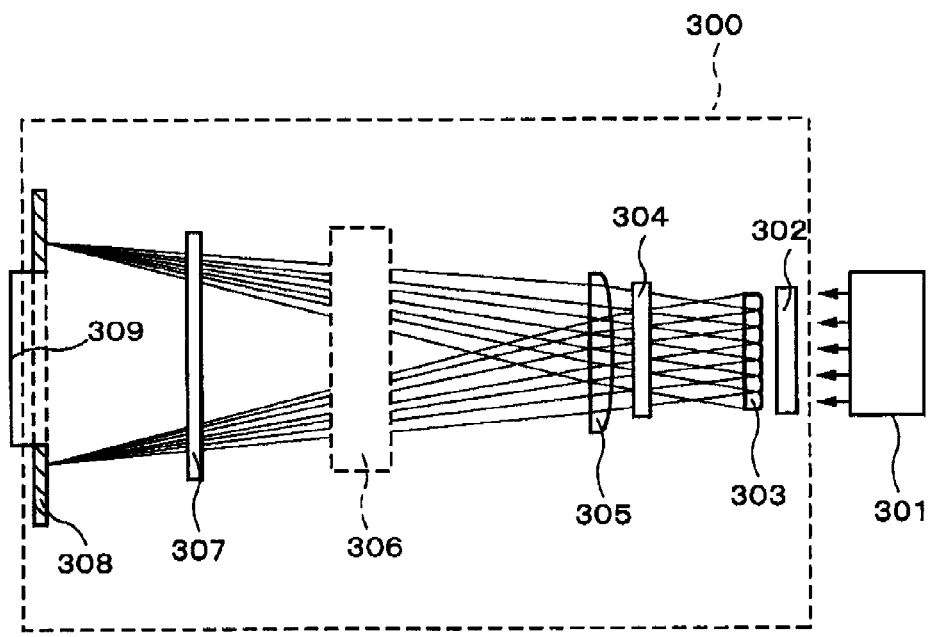
FIG. 2B is a plan view of the same.
Figure 3:
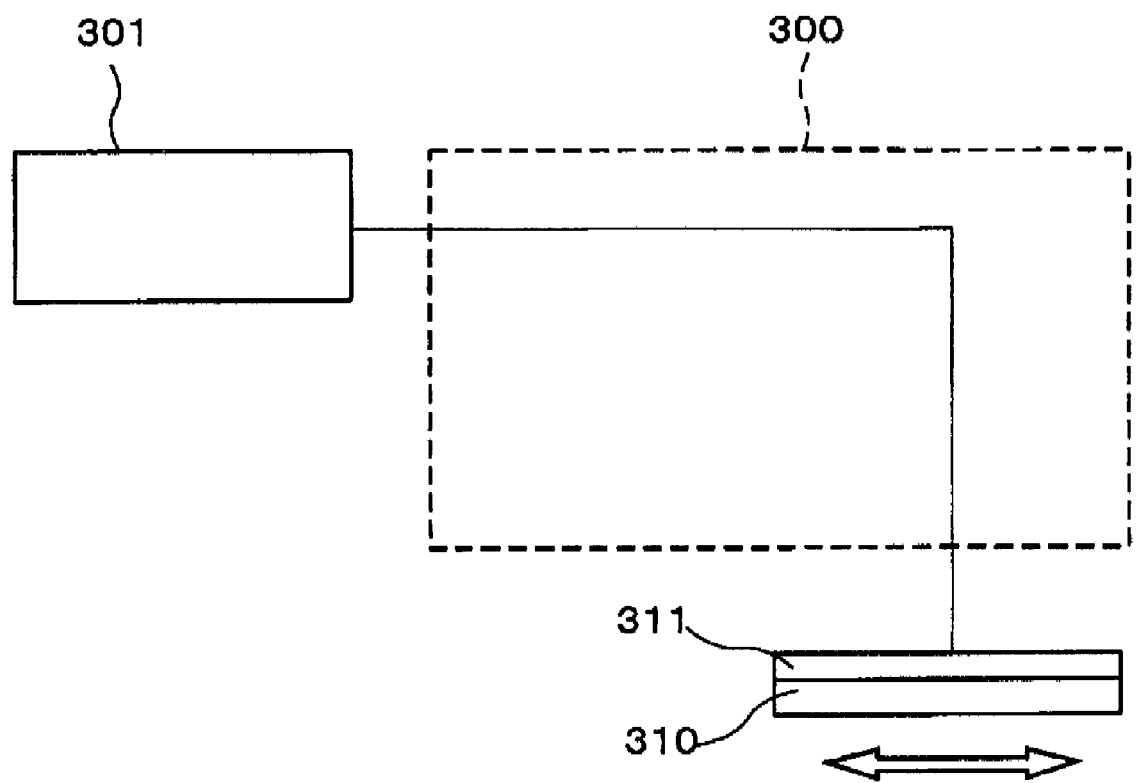
FIG. 3 is a schematic diagram showing a conventional laser annealing apparatus.
Figure 4:
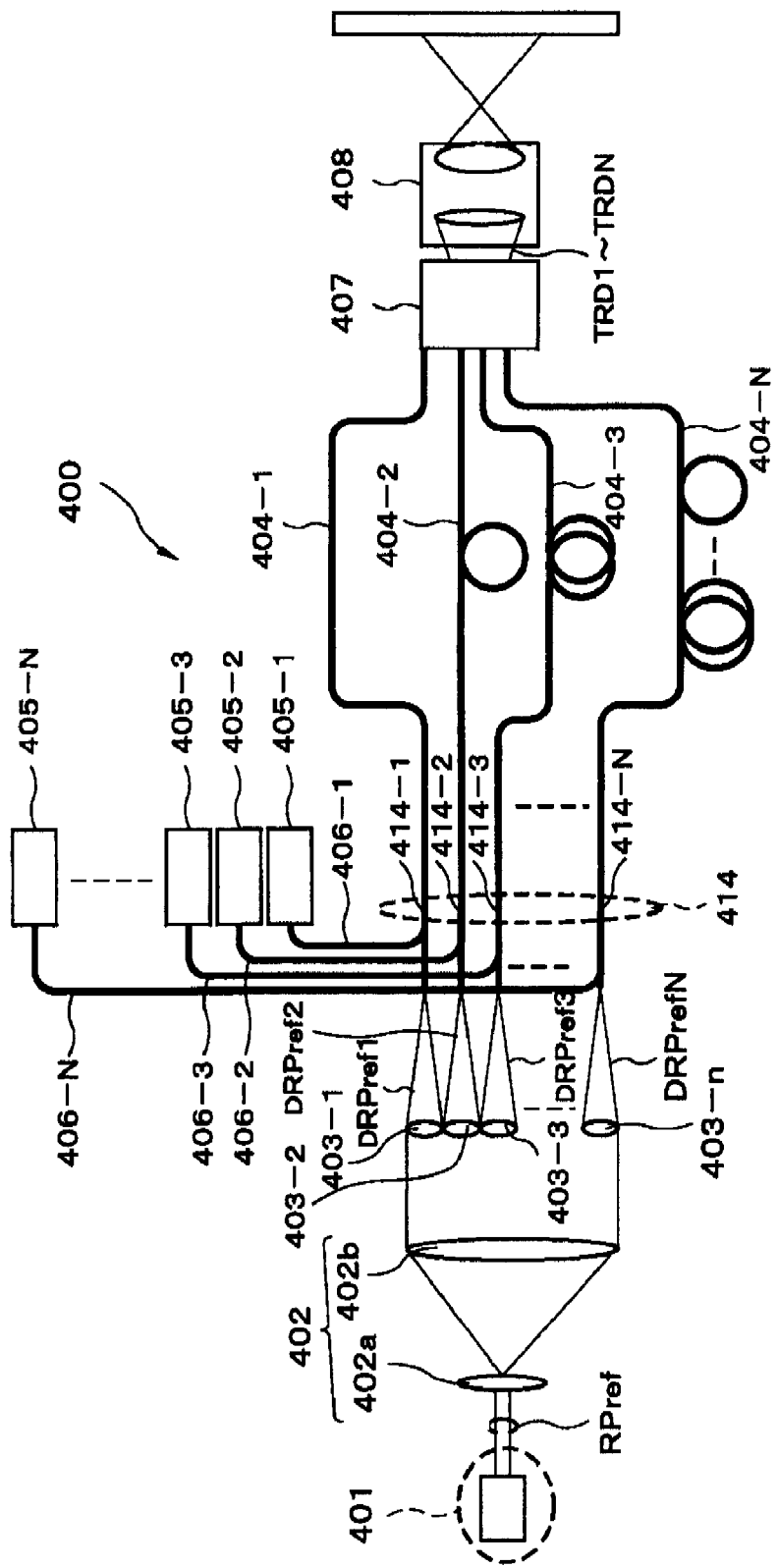
FIG. 4 is a schematic diagram showing the construction of a conventional laser apparatus.
Figure 5:
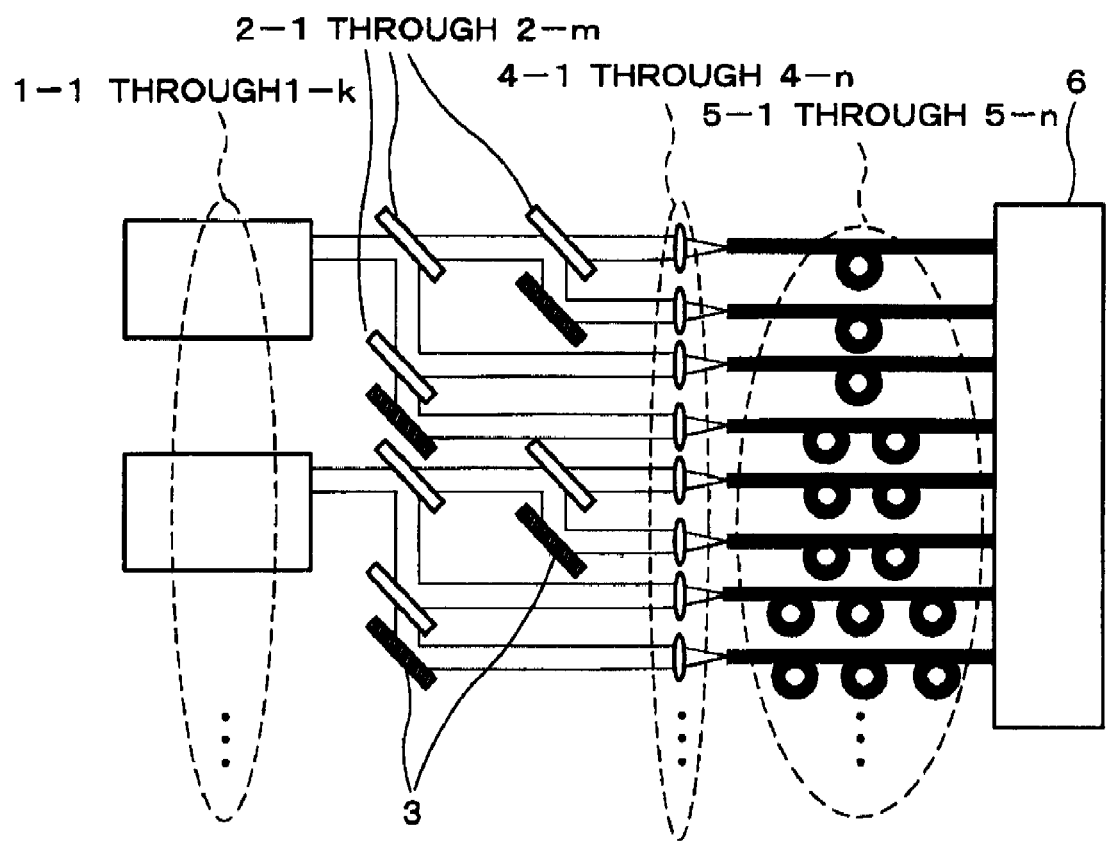
FIG. 5 is a schematic diagram showing the construction of a laser annealing apparatus according to a first embodiment of the present invention.

Below, embodiments of the present invention will be described in concrete terms with reference to the attached figures. FIG. 5 is a schematic diagram showing the construction of a laser annealing apparatus according to a first embodiment of the present invention. First, k (k is a natural number) laser oscillators 1-1 through 1-k which operate by Q switching are arranged side by side, and m (m is a natural number>k) partially reflective mirrors 2-1 through 2-m which have an arbitrary reflectivity and in which dielectric multi-layer films are formed on the respective front surfaces, as well as a plurality of totally reflective mirrors 3, are disposed in front (in optical terms) of the k laser beams that have a high peak power and are emitted from the k laser oscillators 1-1 through 1-k. In the present embodiment, the pulse oscillation timing of the laser beams emitted from the k laser oscillators 1-1 through 1-k is all synchronized, and the m partially reflective mirrors 2-1 through 2-m all have the same reflectivity The k laser beams that are emitted from the k laser oscillators 1-1 through 1-k are split into laser beams on n (n is a natural number>k) light paths having an arbitrary intensity by the m partially reflective mirrors 2-1 through 2-m, and are caused to be incident on n coupling lenses 4-1 through 4-n by the m partially reflective mirrors 2-1 through 2-m and the plurality of totally reflective mirrors 3. In the present embodiment, the laser beams along n light paths all have the same intensity.

Also, n optical fibers 5-1 through 5-n are disposed in accordance with the n laser beams on the surface on which the respective laser beams that are split into n light paths are focused by the n coupling lenses 4-1 through 4-n. In the present embodiment, the n optical fibers 5-1 through 5-n all have the same core diameter.

The core diameters and the splitting number n of these n optical fibers 5-1 through 5-n are arbitrarily optimized based on the outputs of the k laser oscillators 1-1 through 1-k, the desired line width of the linear beam for irradiating the surface that is being worked (amorphous silicon substrate), the upper limit of the power density that can be transmitted by the optical fibers used, and the like. In this case, provided that the laser beam intensity is within the range restricted by the damage threshold value of the end surfaces of the optical fibers, transmission by a single optical fiber for a single laser oscillator is possible.

Generally, however, quartz optical fibers are used for the propagation of high-output laser beams, and the damage threshold value for the end surfaces of such optical fibers is approximately 100 MW/mm$^2$ in the case of SI (step index) optical fibers, and approximately 1 MW/mm$^2$ in the case of GI (grated index) optical fibers, for a laser beam having a pulse width of 10 ns. On the other hand, the laser output of an Nd:YAG laser second harmonic oscillator having a Q switching action has an extremely high peak power exceeding several hundred kilowatts at a pulse width of several tens of nanoseconds. Accordingly, for example, when propagation is attempted using an optical fiber having a core diameter of approximately 100 μm, there is a danger of damage to the end surface, and stable use in industrial applications is difficult to accomplish.

Accordingly, in the present embodiment, k laser beams that have a high peak power and are emitted from k laser oscillators 1-1 through 1-k operated by Q switching are split into n laser beams having a laser power density that substantially allows optical fiber transmission to be performed by m partially reflective mirrors 2-2 through 2-m which have an arbitrary reflectivity and in which dielectric multi-layer films are provided to their respective surfaces. These n laser beams are introduced into n optical fibers 5-1 through 5-n, and stable use is thereby made possible without damaging the end surfaces of the optical fibers.

Furthermore, the n optical fibers 5-1 through 5-n are set at lengths that differ from each other in units of single fibers or a plurality of fibers, the optical propagation delay is varied at the emission ends of the n optical fibers 5-1 through 5-n, and a propagation delay is generated in the laser pulse waveform. For example, in a case in which quartz optical fibers having a refractive index of 1.45 are used, an optical laser pulse waveform delay time of 1 ns can be generated by a difference in fiber length of approximately 20 cm. Accordingly, propagation delay control of the pulse waveform on the nanosecond order can easily be realized by adjusting the fiber length.

Figure 6:
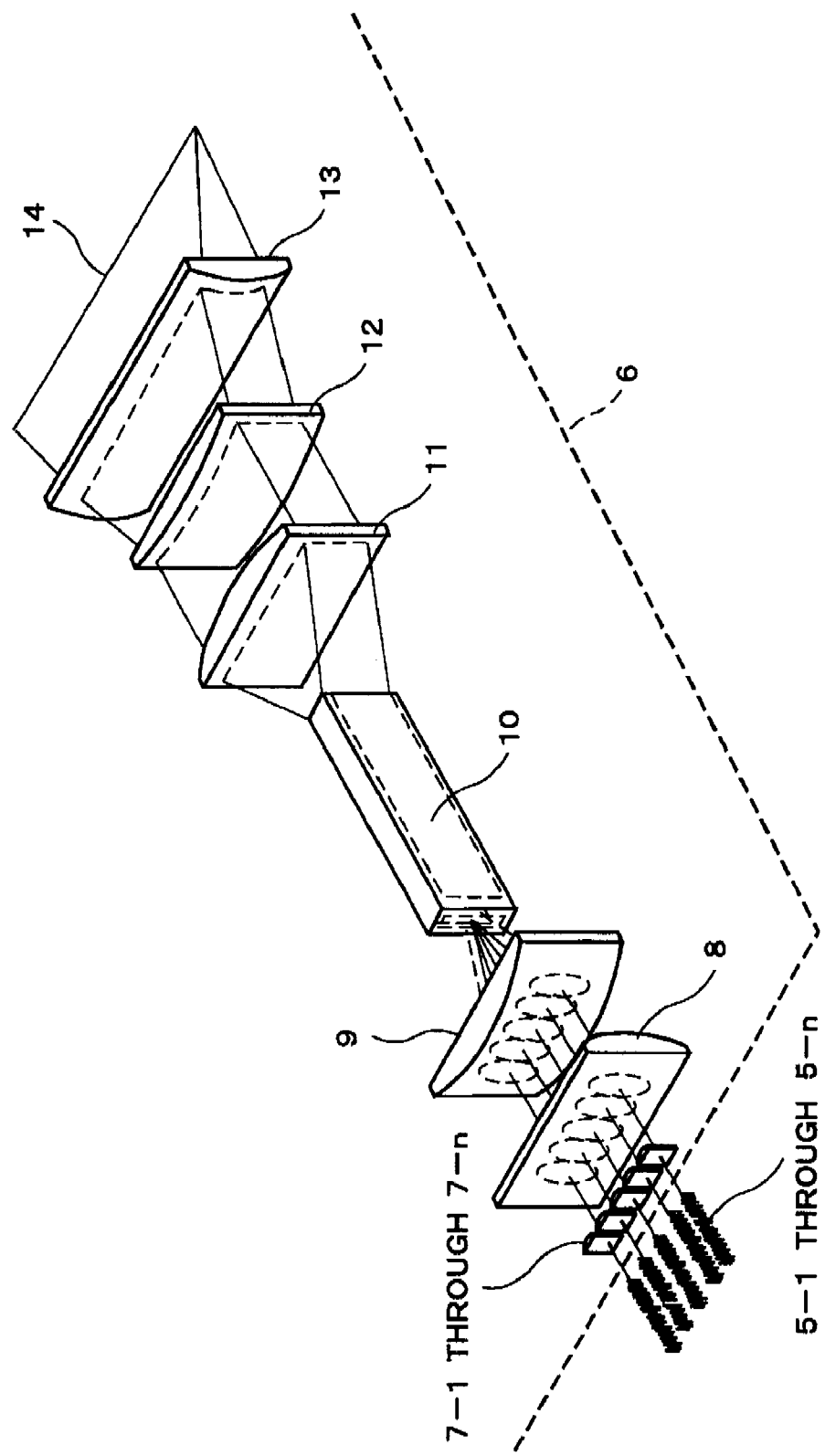
FIG. 6 is a schematic diagram showing one example of the construction of the linear beam formation optical system 6.

As is shown in FIG. 6, disposed in front (in optical terms) of the n optical fibers 5-1 through 5-n is a linear beam formation optical system 6 comprising a first optical system (long-side collimating cylindrical lenses 7-1 through 7-n, short-side collimating cylindrical lens 8, long-side synthesizing and focusing cylindrical lens 9, and plate-form optical waveguide 10) which synthesizes and homogenizes the n laser beams emitted from the optical fibers 5-1 through 5-n, and a second optical system (long-side collimating cylindrical lens 11, long-side focusing cylindrical lens 12, and short-side focusing cylindrical lens 13) which focuses the laser beam emitted from the first optical system on the work piece surface as a rectangular laser beam that is long in the lateral direction and short in the longitudinal direction.

The shape of a laser beam that is emitted from the short-side focusing cylindrical lens 13 is a rectangular shape that is long in the lateral direction and short in the longitudinal direction. In the example shown in the figures, the lateral direction is the horizontal direction. Since this beam shape is long in the lateral direction and short in the longitudinal direction, a linear shape is formed, and the long direction is the laser beam length, while the line width direction in the longitudinal direction (short direction) is the beam width.

FIG. 6 is a schematic diagram showing one example of the construction of the linear beam formation optical system 6. The emission ends of the n optical fibers 5-1 through 5-n are disposed rectilinearly in one direction. In the present embodiment, there is a match between the arrangement direction of the emission ends of the n optical fibers 5-1 through 5-n (the single direction described above) and the long direction of the beam shape of the linear beam 14 from the short-side focusing cylindrical lens 13. Also, the n long-side collimating cylindrical lenses 7-1 through 7-n corresponding to the n optical fibers are disposed on the same optical axis in front (in optical terms) of the n optical fibers 5-1 through 5-n, and the laser beams emitted from the n optical fibers 5-1 through 5-n are collimated in respective fashion in the long arrangement direction by n long-side collimating cylindrical lenses 7-1 through 7-n corresponding to the n laser beams.

A short-side collimating cylindrical lens 8 is disposed on the same optical axis in front (in optical terms) of the n laser beams collimated in respective fashion in the long arrangement direction by the n long-side collimating cylindrical lenses 7-1 through 7-n, and the n laser beams are collimated in respective fashion in the short arrangement direction.

A long-side synthesizing and focusing cylindrical lens 9 is disposed on the same optical axis in front (in optical terms) of the n laser beams collimated in respective fashion in the long arrangement direction and short arrangement direction. As a result, the laser beams are focused in the long direction by a plate-form optical waveguide 10 disposed further in front (in optical terms). The laser beams that are focused by the plate-form optical waveguide 10 are homogenized in the long direction by being caused to propagate in zigzag fashion while repeating critical reflection inside the plate-form optical waveguide 10. Furthermore, in the short direction, the laser beams are propagated as substantially parallel light rays through the inside of the plate-form optical waveguide 10. The beam area, determined by the core diameters and the emission NA (numerical aperture) of the n optical fibers 5-1 through 5-n, is maintained. It would also be possible to use a micro-lens array (fly-eye lens) or the like instead of the plate-form optical waveguide 10.

As was described above, laser beams emitted from the n optical fibers 5-1 through 5-n are homogenized in the long direction by a first optical system constructed from the long-side collimating cylindrical lenses 7-1 through 7-n, short-side collimating cylindrical lens 8, long-side synthesizing and focusing cylindrical lens 9, and plate-form optical waveguide 10.

A long-side collimating cylindrical lens 11 is disposed on the same optical axis in front (in optical terms) of the laser beam homogenized in the long direction by the first optical system, and the laser beam is further collimated in the long arrangement direction by the long-side collimating cylindrical lens 11.

A long-side focusing cylindrical lens 12 is disposed in front (in optical terms) of the laser beam emitted from the long-side collimating cylindrical lens 11, and the laser beam is adjusted to a desired laser beam length in the long direction by the long-side focusing cylindrical lens 12.

A short-side focusing cylindrical lens 13 is disposed on the same optical axis in front (in optical terms) of the laser beam adjusted to the desired laser beam length in the long direction, and the laser beam is adjusted to the desired linear beam width (line width) in the short direction by this short-side focusing cylindrical lens 13. In this case, the ratio of the focal distances of the short-side collimating cylindrical lens 8 and short-side focusing cylindrical lens 13 is the reduction ratio in the short direction. The product of the respective core diameters of the n optical fibers 5-1 through 5-n and the reduction ratio in the short direction is the width (line width) in the short direction of the rectangular linear beam 14. The beam is long in the lateral direction and short in the longitudinal direction and is emitted from the short-side focusing cylindrical lens 13 and is directed onto the amorphous silicon substrate (not shown in the figures).

As a result, the laser beam homogenized in the long direction by the first optical system is focused as a linear beam 14 having the desired laser beam length and beam width (line width) on the work piece surface (amorphous silicon substrate) by the second optical system constructed from the long-side collimating cylindrical lens 11, long-side focusing cylindrical lens 12, and short-side focusing cylindrical lens 13.

Here, the laser beam line width that is required in the crystallization annealing of an amorphous substrate by a laser beam is ordinarily several tens of micrometers. In the short direction, in a case in which, for example, the core diameter of the optical fibers 5-1 through 5-n is 100 μm, the reduction ratio (ratio of the focal distances of the short-side collimating cylindrical lens 8 and short-side focusing cylindrical lens 13) that is required for irradiation with a linear beam having a width of 50 μm is ½ times, which can easily be realized. On the other hand, in a method in which a laser beam is introduced into the linear beam formation optical system 6 and formed into a linear beam by using a single optical fiber which has a sufficiently large core diameter so that there is no danger of damage to the end surface, the linear beam that is formed is directed onto the amorphous substrate, whereupon a reducing optical system with a magnification of 1/20 is required in order to reduce the beam to a linear beam having a width of 50 μm in a case in which (for example) the core diameter of the optical fiber is 1 mm. Accordingly, in cases in which the emission NA at the time of emission from the optical fiber is large, manufacture of the optical system is difficult.

As was described above, k laser beams that have a high peak power and are emitted from k laser oscillators operated by Q switching are split into laser beams along n light paths having a laser power density that substantially allows optical fiber transmission to be performed, and these n laser beams are introduced into n optical fibers 5-1 through 5-n. Transmission by means of slender optical fibers is thereby made possible even in the case of a laser pulse that has an extremely high peak power. Furthermore, since the emission ends of the n optical fibers are linearly disposed only in the long direction, the beam quality in the short direction can be maintained, and the desired line width (several tens of micrometers) can be obtained using a low-ratio reducing optical system in the short direction.

Furthermore, the n-optical fibers 5-1 through 5-n are set at lengths that differ from each other in units of single fibers or a plurality of fibers, the optical propagation delay of the emitted beams is varied at the emission ends of the n optical fibers 5-1 through 5-n, and a propagation delay is produced in the laser pulse waveform. As a result, the linear beam 14 that is directed onto the amorphous silicon substrate has a laser pulse waveform that maintains this propagation delay. Accordingly, the pulse waveform of the linear beam 14 in the short direction can be varied by varying the lengths of the n optical fibers 5-1 through 5-n. Furthermore, the respective lengths of the n optical fibers 5-1 through 5-n can also be made the same. In this case, the laser pulse waveform obtained from the k laser oscillators is reproduced without further modification even after emission from the n optical fibers 5-1 through 5-n.

Figure 7:
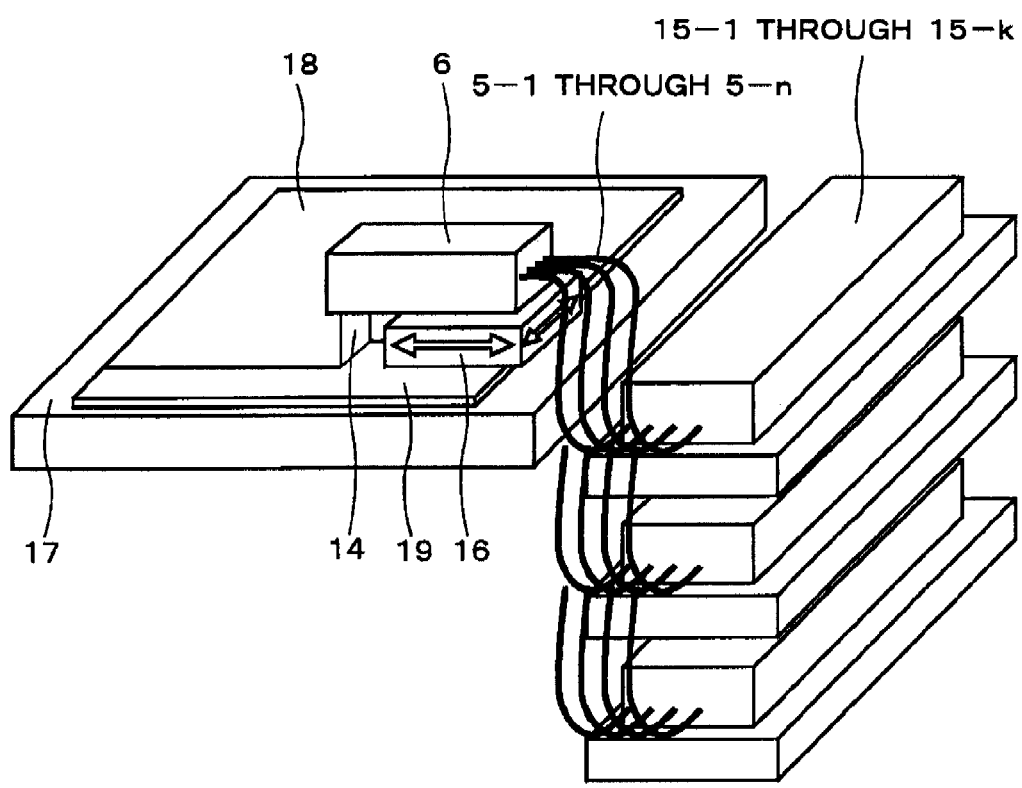
FIG. 7 is a schematic diagram showing an overall view of the laser annealing apparatus constituting a first embodiment of the present invention.

Next, the operation of the present embodiment constructed as described above will be described. FIG. 7 is a schematic diagram showing an overall view of the laser annealing apparatus of the present embodiment. In FIG. 7, constituent elements that are the same as in FIGS. 5 and 6 are labeled with the same symbols, and a detailed description of such elements is omitted. First, k (k is a natural number) laser oscillators 15-1 through 15-k operated by Q switching are disposed side by side, and a total of n optical fibers 5-1 through 5-n (n is a natural number>k) are connected to one end of each of these k laser oscillators 15-1 through 15-k. Here, the k laser oscillators 15-1 through 15-k fulfill the functions of the portions that extend from the k laser oscillators 1-1 through 1-k to the m partially reflective mirrors 2-1 through 2-m, the plurality of totally reflective mirrors 3, and the n fiber coupling lenses 4-1 through 4-n in FIG. 5.

The other ends of the n optical fibers 5-1 through 5-n are connected to a linear beam formation optical system 6 carried on a biaxial operating stage 16. A stage 17 on which an amorphous silicon substrate 18 is carried is installed in front (in optical terms) of the linear beam formation optical system 6.

The k (k is a natural number) laser oscillators 15-1 through 15-k emit k laser beams, and these k laser beams are split into n laser beams having a laser power density that substantially allows optical fiber transmission to be performed. Also, n laser beam outputs are transmitted to the n optical fibers 5-1 through 5-n (n is a natural number>k). The n laser beams are emitted from the emission ends of the n optical fibers 5-1 through 5-n, and are incident on the linear beam formation optical system 6.

The laser beams incident on the linear beam formation optical system 6 are homogenized in the long direction by the first optical system, and are focused by the second optical system as a rectangular laser beam (linear beam 14) onto the work piece surface (amorphous silicon substrate 18) carried on the stage 17. The beam is long in the lateral direction and short in the longitudinal direction, and has a beam shape of the desired laser beam length and beam width (line width). The portion of the amorphous silicon substrate 18 that is irradiated by the linear beam 14 is modified to poly-silicon 19.

In the laser annealing apparatus of the present embodiment, the k laser oscillators 15-1 through 15-k operated by Q switching emit k laser beams that have a high peak power. The k laser beams are split into n laser beams having a laser power density that substantially allows optical fiber transmission to be performed. The n laser beams are introduced into n optical fibers 5-1 through 5-n, and stable use is thereby made possible without damaging the end surfaces of the optical fibers. Since the flexibility is improved using optical fibers, the entire surface of the amorphous silicon substrate 18 can be irradiated with the linear beam 14 by fastening and supporting the k laser oscillators 15-1 through 15-k, carrying the linear beam formation optical system 6 on a biaxial operating stage 16, and scanning the biaxial operating stage 16. As a result, the stability of the laser annealing apparatus is improved, and the biaxial operating stage 16 can be made compact since it is necessary to move only the linear beam formation optical system 6, which is light in weight compared to the k laser oscillators 15-1 through 15-k.

Next, a second embodiment of the present invention will be described. In the first embodiment described above, the pulse oscillation timing of all the laser beams emitted from the k laser oscillators was synchronized. The present embodiment is different in that the pulse oscillation timing of the laser beams emitted from the k laser oscillators is adjusted, and the pulse waveform of the laser beams emitted from the emission ends of the n optical fibers 5-1 through 5-n is varied over time. The remaining structure of the second embodiment is the same.

A propagation delay effect is obtained in the laser pulse waveform by generating a difference in the pulse oscillation timing of the laser beams emitted from the k laser oscillators 15-1 through 15-k shown in FIG. 7. For example, a difference in fiber length of 20 m or greater is required in a case in which an optical pulse waveform delay time of 100 ns or greater is controlled by the fiber length of a quartz fiber with a refractive index of 1.45. In this case, it is desirable that the pulse oscillation timing of the laser beams emitted from the laser oscillators be controlled.

Next, a third embodiment of the present invention will be described. The present embodiment differs in that when the k laser beams emitted from the k laser oscillators 1-1 through 1-k in the first embodiment are split into laser beams along n light paths having an arbitrary laser intensity by the m partially reflective mirrors 2-1 through 2-m, the reflectivity of the m partially reflective mirrors 2-1 through 2-m is varied, and the intensity of the laser beams incident on the n optical fibers 5-1 through 5-n is thereby varied as well. The remaining structure is the same.

The splitting ratios of the laser beams are different in cases in which the reflectivity levels of the m partially reflective mirrors 2-1 through 2-m differ from each other. As a result, the intensities of the laser beams that are incident on the n optical fibers 5-1 through 5-n are different as well. The n laser beams that are transmitted by the n optical fibers 5-1 through 5-n and emitted from the emission ends of the n optical fibers 5-1 through 5-n are propagated as substantially parallel light rays inside the plate-form optical waveguide 10 in the short direction. Since the beam area determined by the core diameter and the emission numerical aperture (emission NA) of the n optical fibers 5-1 through 5-n is maintained, the intensity in the line width direction of the rectangular linear beam 14, which is long in the lateral direction and short in the longitudinal direction and which is directed onto the work piece surface (amorphous silicon substrate 18), is controlled by the splitting ratio of the laser beams with the aid of the m partially reflective mirrors 2-1 through 2-m.

Figure 8:
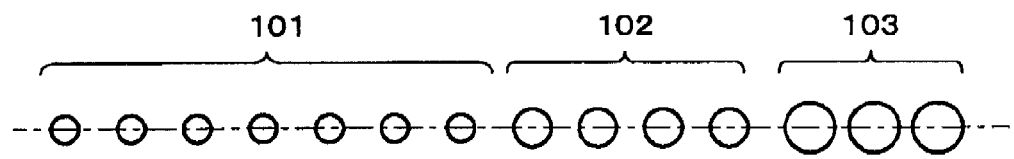
FIG. 8 is a schematic diagram showing one example of the arrangement of the optical fibers in a laser annealing apparatus constituting a fourth embodiment of the present invention.

Next, a fourth embodiment of the present invention will be described. FIG. 8 is a schematic diagram showing one example of the arrangement of the optical fibers in the present embodiment. In the first embodiment, all the core diameters of the n optical fibers 5-1 through 5-n were the same. In the present embodiment, on the other hand, as is shown in FIG. 8, the core diameters of the n optical fibers 5-1 through 5-n are varied in units of single fibers or a plurality of fibers, and the remaining structure is similar to that of the first embodiment. As a result, it is possible to adjust the beam intensity distribution in the short direction of the beam shape of the laser beam that is focused on the work piece surface (amorphous silicon substrate) by the second optical system constructed from the long-side focusing cylindrical lens 12 and short-side focusing cylindrical lens 13.

As is shown in FIG. 8, three sets of optical fibers having different core diameters and fiber lengths are disposed in a single straight line. The respective core diameters $R_{101}$ of the slender optical fiber set 101 are the smallest, and the respective fiber lengths $L_{101}$ are the smallest as well. In the intermediate optical fiber set 102 having the core diameters $R_{102}$, the respective core diameters $R_{102}$ are larger than the respective $R_{101}$ of the slender optical fiber set 101, and the respective fiber lengths $L_{102}$ are longer than the respective fiber lengths $L_{101}$ of the slender optical fiber set 101. In the thick optical fiber set 103, the respective core diameters $R_{103}$ are larger than the respective core diameters $R_{102}$ of the intermediate optical fiber set 102, and the respective fiber lengths $L_{103}$ are longer than the respective fiber lengths $L_{102}$ of the intermediate optical fiber set 102.

In cases in which the respective core diameters of the n optical fibers 5-1 through 5-n are set at different diameters, the laser beams emitted from the more slender optical fibers are focused at a finer line width, and the laser beams emitted from the thicker optical fibers are focused at a wider line width. As a result, the laser beam intensity distribution in the short direction, i.e., the beam intensity distribution in the line width direction of the linear beam 14, can be controlled by the core diameters of the n optical fibers 5-1 through 5-n.

Figure 9:
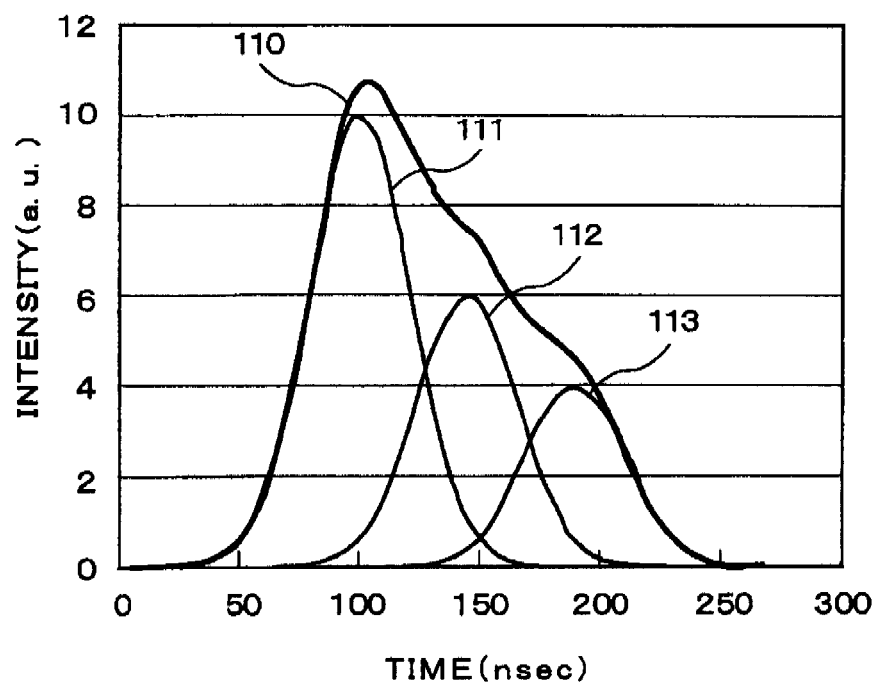
FIG. 9 is a graph showing one example of the laser pulse waveform obtained by the arrangement of optical fibers shown in FIG. 8.

FIG. 9 shows one example of the laser pulse waveform obtained by arranging optical fibers as shown in FIG. 8. First, irradiation is performed using the laser pulse obtained by the slender optical fiber set 101 that has the most slender diameter and the shortest length (laser pulse intensity distribution 111). Next, irradiation is performed using the laser pulse obtained by the intermediate optical fiber set 102 that has an intermediate diameter and an intermediate length (laser pulse intensity distribution 112). Finally, irradiation is performed using the laser pulse obtained by the thick optical fiber set 103 that has the maximum diameter and the longest length (laser pulse intensity distribution 113), and the synthesized laser pulse intensity distribution 110 is thereby obtained as temporally synthesized laser pulse intensity.

In the example described above, the power of the transmitted laser beams is controlled by varying the number of optical fibers of respective diameters. However, if the power is within the range restricted by the damage threshold value of the end surfaces of the optical fibers, it would also be possible to adjust the power of the transmitted laser beams by employing a spit ratio for the m (m is a natural number>k) partially reflective mirrors 2-1 through 2-m, as in the third embodiment described above.

Next, a fifth embodiment of the present invention will be described. In the first embodiment described above, the arrangement direction of the emission ends of the n optical fibers 5-1 through 5-n coincided with the long direction of the beam shape of the linear beam 14 emitted from the short-side focusing cylindrical lens 13. In the present embodiment, on the other hand, the emission ends of the n optical fibers 5-1 through 5-n are disposed so that these emission ends are shifted in units of single fibers or a plurality of fibers in the direction perpendicular to the long direction of the beam shape of the linear beam 14 from the short-side focusing cylindrical lens 13. The remaining structure is similar to that of the first embodiment. As a result, it is possible to adjust the beam intensity distribution in the short direction of the beam shape of the laser beam that is focused on the work piece surface (amorphous silicon substrate) by the second optical system constructed from the long-side focusing cylindrical lens 12 and short-side focusing cylindrical lens 13.

The emission ends of the n optical fibers 5-1 through 5-n are shifted in the direction perpendicular to the long direction of the beam shape of the linear beam 14 from the short-side focusing cylindrical lens 13 in units of single fibers or a plurality of fibers, rather than the emission ends of the n optical fibers 5-1 through 5-n being disposed so as to coincide with the long direction of the beam shape of the linear beam 14 from the short-side focusing cylindrical lens 13. As a result, the position where the linear beam 14 is focused in the short direction is shifted in parallel by a distance obtained by multiplying the amount of shift at the time of incidence of the laser beams on the short-side collimating cylindrical lens 8 by the reduction ratio (ratio of the focal distances of the short-side collimating cylindrical lens 8 and short-side focusing cylindrical lens 13).

In this case, the n optical fibers 5-1 through 5-n are set at lengths that differ from each other in units of single fibers or a plurality of fibers, and the optical propagation delay of the emitted beams is therefore varied at the emission ends of the n optical fibers 5-1 through 5-n, thus generating a propagation delay in the laser pulse waveform, so that the liner beam 14 is scanned in the line width direction. In this case, if the respective lengths of the n optical fibers 5-1 through 5-n are made the same, the position where the linear beam 14 is focused in the short direction is shifted in parallel by a distance obtained by multiplying the amount of shift at the time of incidence of the laser beams on the short-side collimating cylindrical lens 8 by the reduction ratio (ratio of the focal distances of the short-side collimating cylindrical lens 8 and short-side focusing cylindrical lens 13). Furthermore, the respective lengths of the n optical fibers 5-1 through 5-n are made the same, and the pulse oscillation timing of the laser beams emitted from the k laser oscillators is adjusted so that a propagation delay is generated in the pulse waveform of the laser beams emitted from the emission ends of the n optical fibers 5-1 through 5-n. The linear beam 14 can thereby also be scanned in the line width direction by performing time control of the laser pulse waveform.

Furthermore, for example, in the first embodiment described above, the emission ends of the n optical fibers 5-1 through 5-n are arranged linearly in a single row in the long direction in FIG. 6. However, this arrangement is not limited to a single row. For example, in cases in which the amorphous silicon substrate is simultaneously irradiated with a linear beam at fixed intervals, a linear arrangement in a plurality of rows is also possible. In this case, the spacing of the linear beams directed onto the amorphous silicon substrate is obtained by multiplying the arrangement spacing of the optical fibers by the reduction ratio in the short direction (the ratio of the focal distances of the short-side collimating cylindrical lens 8 and short-side focusing cylindrical lens 13).

Figure 10:
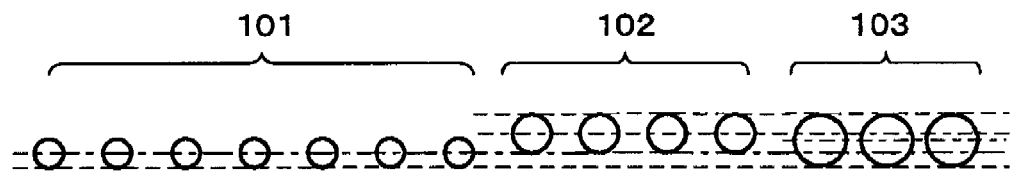
FIG. 10 is a schematic diagram showing one example of the arrangement of the optical fibers in a laser annealing apparatus according to a sixth embodiment of the present invention.

Next, a sixth embodiment of the present invention will be described. FIG. 10 is a schematic diagram showing one example of the arrangement of the optical fibers in this embodiment. In the present embodiment, as is shown in FIG. 10, the emission ends of the n optical fibers 5-1 through 5-n are shifted in units of single fibers or a plurality of fibers in the direction perpendicular to the long direction of the beam shape of the linear beam 14 from the short-side focusing cylindrical lens 13, and the core diameters of the n optical fibers 5-1 through 5-n are also varied in units of single fibers or a plurality of fibers.

As is shown in FIG. 10, three sets of optical fibers having different core diameters and fiber lengths are provided. In the slender optical fiber set 101, the respective core diameters $R_{101}$ are the shortest, and the respective fiber lengths $L_{101}$ are also the shortest.

An intermediate optical fiber set 102 having core diameters $R_{102}$ is linearly disposed so that this set is slightly shifted from a straight line connecting the respective centers of the slender optical fiber set 101. The straight line connecting the respective centers of the slender optical fiber set 101 and the straight line connecting the respective centers of the intermediate optical fiber set 102 are parallel to each other. The respective core diameters $R_{102}$ of the intermediate optical fiber set 102 are larger than the respective core diameters $R_{101}$ of the slender optical fiber set 101, and the respective fiber lengths $L_{102}$ are longer than the respective fiber lengths $L_{101}$ of the slender optical fiber set 101.

A thick optical fiber set 103 is disposed in the form of a straight line that is positioned between a straight line connecting the respective centers of the slender optical fiber set 101 and a straight line connecting the respective centers of the intermediate optical fiber set 102. The respective core diameters $R_{103}$ are greater than the respective core diameters $R_{102}$ of the intermediate optical fiber set 102, and the respective fiber lengths $L_{103}$ are longer than the respective fiber lengths $L_{102}$ of the intermediate optical fiber set 102.

Figure 11:
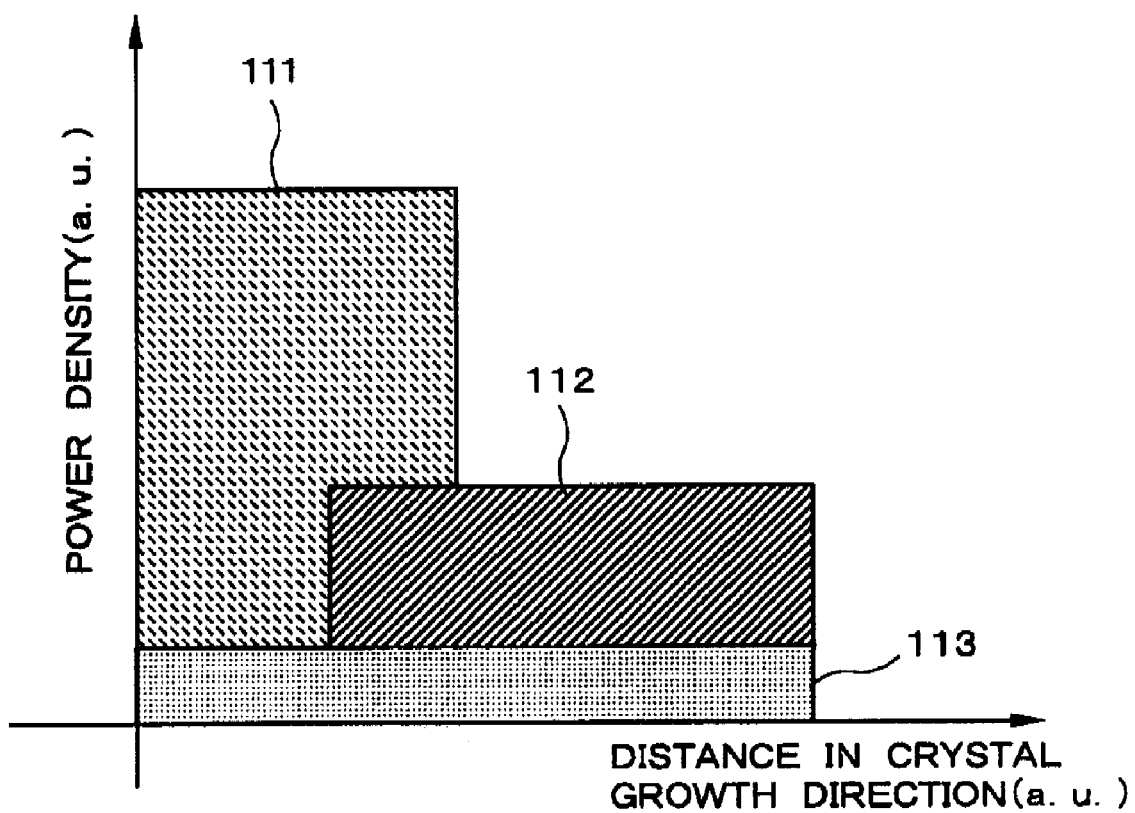
FIG. 11 is a graph showing one example of the laser pulse waveform obtained by the arrangement of optical fibers shown in FIG. 10.

FIG. 11 is a graph showing one example of the spatial intensity distribution of the laser pulse obtained by the arrangement of optical fibers shown in FIG. 10. First, irradiation is performed with a laser pulse 111 obtained by the slender optical fiber set 101, which has the most slender diameters and the shortest fiber lengths. Next, irradiation is performed using the intermediate optical fiber set 102, which has intermediate diameters and intermediate lengths, with partial overlapping relative to the laser pulse 111 used for the previous irradiation. Finally, irradiation is performed using the laser pulse 113 obtained by means of the thick optical fiber set 103 that has the largest diameters and longest lengths, so that the laser pulses 111 and 112 used in the previous irradiations are enveloped.

First, irradiation is initially performed using a laser pulse having a power density sufficient to melt the amorphous silicon substrate from a solid to a liquid in a single process. Accordingly, the slender optical fiber set 101 that has the most slender diameters and shortest lengths is used for the transmission of the laser pulse 111. The laser pulse 112 used in the subsequent irradiation is transmitted by the intermediate optical fiber set 102 having intermediate diameters and intermediate lengths, and this intermediate optical fiber set 102 is disposed so that as to be slightly shifted from the lateral direction (direction of the substrate surface) in which the crystal is grown. The laser pulse 113 that is used in even later irradiation and is transmitted by the thick optical fiber set 103 having the largest diameters and longest lengths has large fiber core diameters, and therefore heats the entire irradiated surface at the lowest power density, so that abrupt cooling of the liquefied silicon is prevented, thus further promoting crystal growth. As a result, during the extremely short thermal relaxation time of an amorphous silicon film having a thickness of about 100 nm, a variation in the spatial intensity distribution of the laser pulse in the region of several micrometers to several tens of micrometers can be realized, and more-optimal laser heating control is possible.

In the above example as well, the power of the transmitted laser beams is controlled by varying the number of optical fibers of respective diameters, but if the power is within the range restricted by the damage threshold value of the end surfaces of the optical fibers, the power of the transmitted laser beams can also be adjusted by means of the splitting ratio of the m (m is a natural number>k) partially reflective mirrors 2-1 through 2-m.

In the laser annealing apparatus of the present invention, a laser pulse having an extremely high peak power can be transmitted by means of a slender optical fiber without damaging the end surface of the optical fiber by splitting k laser beams that have a high peak power and are emitted from k laser oscillators 1-1 through 1-k operated by Q switching into n laser beams having a laser power density that substantially allows optical fiber transmission by means of m partially reflective mirrors 2-1 through 2-m, and introducing these n laser beams into n optical fibers 5-1 through 5-n. Furthermore, since the n optical fibers 5-1 through 5-n are linearly disposed only in the long direction, the beam quality in the short direction can be maintained, and the desired line width (several tens of micrometers) can therefore be obtained using a low-ratio reducing optical system in the short direction.

A propagation delay can also be optically generated in the laser pulse waveform by using the fiber lengths of the n optical fibers 5-1 through 5-n, and a propagation delay effect of the laser pulse waveform can also be obtained by adjusting the pulse oscillation timing of the laser beams emitted from the k laser oscillators 1-1 through 1-k.

The laser beam splitting ratio and the core diameters of the n optical fibers 5-1 through 5-n can also be adjusted by adjusting the reflectivity of the m partially reflective mirrors 2-1 through 2-m, making it possible to control the beam intensity distribution of the linear beam 14 in the line width direction.

Furthermore, it is possible to shift the position where the linear beam 14 is focused in the short direction by arranging the emission ends of the n optical fibers so that these emission ends are shifted in the direction perpendicular to a straight line parallel to the lens main surface of the short-side collimating cylindrical lens 8.

The laser pulse waveform and the intensity distribution of the linear beam 14 can be arbitrarily varied with a high degree of freedom by combining the adjustments of the fiber lengths of the n optical fibers 5-1 through 5-n, the pulse oscillation timing of the laser beams emitted from the k laser oscillators 1-1 through 1-k, the splitting ratio of the laser beams, which is obtained by adjusting the reflectivity levels of the m partially reflective mirrors 2-1 through 2-m, and the arrangement of the emission ends of the n optical fibers.

It is thereby possible to simultaneously to control the beam intensity of the linear beam 14 over time on the nanosecond order and to control the spatial beam intensity on the micrometer order so that the intensity is optimal for the crystallization annealing of an amorphous silicon substrate by the laser beam.

What is claimed is:

1. A laser annealing apparatus comprising:
   a laser oscillator having a Q switching action;
   one or a plurality of partially reflective mirrors for splitting a laser beam emitted from said laser oscillator into a plurality of laser beams;
   a plurality of optical fibers which respectively transmit the plurality of laser beams split by said partially reflective mirrors, and whose respective emission ends are arranged linearly in one direction;
   a first optical system for synthesizing and homogenizing the plurality of laser beams emitted from said optical fibers; and
   a second optical system for focusing the laser beam emitted from said first optical system on the work piece surface as a rectangular laser beam whose beam shape is long in the lateral direction and short in the longitudinal direction.

2. The laser annealing apparatus according to claim 1, wherein
   said optical fibers are set at lengths that differ from each other in units of single fibers or a plurality of fibers;
   the amount of optical propagation delay of the emitted laser beams is caused to vary at the emission ends of said optical fibers; and
   the laser beam waveform is caused to differ from the waveform at the time of emission from said laser oscillator.

3. The laser annealing apparatus according to claim 2, wherein
   a plurality of said laser oscillators is provided;
   said optical fibers are connected to said plurality of laser oscillators in units of single fibers or a plurality of fibers; and
   the pulse oscillation timing of the laser beams emitted from said laser oscillators is adjusted and the pulse waveform of the laser beams emitted from said optical fibers is caused to vary over time.

4. The laser annealing apparatus according to claim 2, wherein the intensity of the laser beams that are incident on said optical fibers is varied in units of single fibers or a plurality of fibers by varying the reflectivity of said partially reflective mirrors.

5. The laser annealing apparatus according to claim 1, wherein the core diameter of said optical fibers is varied in units of single fibers or a plurality of fibers; and the beam intensity distribution in the short longitudinal direction of the beam shape of the laser beam focused by said second optical system is adjusted.

6. The laser annealing apparatus according to claim 1, wherein the emission ends of said optical fibers are shifted in the direction perpendicular to said single direction in units of single fibers or a plurality of fibers; and the pulse waveform of the laser beams is shifted in said short longitudinal direction of the beam shape focused by said second optical system.

7. The laser annealing apparatus according to claim 1, wherein the beam intensity distribution in the short longitudinal direction of the beam shape of said laser beams is adjusted by varying said core diameter in units of single fibers or a plurality of fibers; and the pulse waveform of the laser beams is shifted in said short longitudinal direction of said beam shape by arranging said emission ends so that the ends are shifted in the direction perpendicular to said single direction in units of single fibers or a plurality of fibers.

\* \* \* \* \*